US009960766B2

(12) United States Patent
Wang et al.

(10) Patent No.: US 9,960,766 B2
(45) Date of Patent: May 1, 2018

(54) INSULATED GATE BIPOLAR TRANSISTOR DRIVING CIRCUIT

(71) Applicants: BOE TECHNOLOGY GROUP CO., LTD., Beijing (CN); BEIJING BOE ENERGY TECHNOLOGY CO., LTD., Beijing (CN)

(72) Inventors: Qingmeng Wang, Beijing (CN); Xiaoyan Han, Beijing (CN)

(73) Assignees: BOE TECHNOLOGY GROUP CO., LTD., Beijing (CN); BEIJING BOE TECHNOLOGY CO., LTD., Beijng (CN)

( * ) Notice: Subject to any disclaimer, the term of this patent is extended or adjusted under 35 U.S.C. 154(b) by 0 days. days.

(21) Appl. No.: 15/108,593

(22) PCT Filed: Dec. 22, 2015

(86) PCT No.: PCT/CN2015/098214
§ 371 (c)(1),
(2) Date: Jun. 28, 2016

(87) PCT Pub. No.: WO2017/008441
PCT Pub. Date: Jan. 19, 2017

(65) Prior Publication Data
US 2017/0149431 A1      May 25, 2017

(30) Foreign Application Priority Data

Jul. 15, 2015   (CN) .......................... 2015 1 0415519

(51) Int. Cl.
*H03K 17/78*      (2006.01)
*H03F 1/52*       (2006.01)
(Continued)

(52) U.S. Cl.
CPC ............... *H03K 17/78* (2013.01); *H03F 1/52* (2013.01); *H03F 3/08* (2013.01); *H03F 3/21* (2013.01);
(Continued)

(58) Field of Classification Search
CPC .......... H03K 17/78; H03K 5/08; H03K 17/79; H03K 17/795; H03F 3/26; H03F 3/21; H03F 1/52
See application file for complete search history.

(56) References Cited

U.S. PATENT DOCUMENTS 7,466,185 B2    12/2008  Bayerer
7,570,101 B1 *   8/2009  Short ................... H03K 17/168
                                                 327/432
(Continued)

FOREIGN PATENT DOCUMENTS

CN    201708537 U    1/2011
CN    102332705 A    1/2012
(Continued)

OTHER PUBLICATIONS

"A Driver Design for an IGBT Module", 360doc, Aug. 22, 2017. Translation provided by Dragon Intellectual Property Law Firm.
(Continued)

*Primary Examiner* — Jung Kim
(74) *Attorney, Agent, or Firm* — Harness, Dickey & Pierce, P.L.C.

(57) ABSTRACT

The present disclosure provides an IGBT driving circuit, including an optocoupler chip and a power amplification circuit. The optocoupler chip includes an isolation amplification unit and a fault protection unit, and the fault protection unit includes a desaturation module and a fault feedback module. The desaturation module is configured to transmit a warning signal to the fault feedback module when detecting
(Continued)

that a potential of a collector of the IGBT is overhigh or the potential of the collector of the IGBT changes overfast. The fault feedback module is configured to transmit a fault control signal to the external controller after receiving the warning signal so as to control the external driving signal outputted by the external controller and enable the isolation amplification unit to output an IGBT driving signal for controlling a shutdown of the IGBT.

9 Claims, 3 Drawing Sheets

(51) Int. Cl.
    H03F 3/21      (2006.01)
    H03F 3/26      (2006.01)
    H03K 5/08      (2006.01)
    H03F 3/08      (2006.01)
    H03F 3/30      (2006.01)
    H03K 17/60     (2006.01)
    H03K 17/16     (2006.01)
(52) U.S. Cl.
    CPC .............. *H03F 3/26* (2013.01); *H03F 3/3069* (2013.01); *H03K 5/08* (2013.01); *H03K 17/168* (2013.01); *H03K 17/603* (2013.01); *H03K 17/163* (2013.01)

(56) References Cited

U.S. PATENT DOCUMENTS

| | | | |
|---|---|---|---|
| 8,760,218 B2* | 6/2014 | Zhu | H02M 1/08 323/312 |
| 9,214,934 B2* | 12/2015 | Cottell | H03K 17/78 |
| 2008/0106319 A1 | 5/2008 | Bayerer | |
| 2015/0155700 A1 | 6/2015 | Alvarez Valenzuela et al. | |
| 2017/0149431 A1 | 5/2017 | Wang et al. | |

FOREIGN PATENT DOCUMENTS

| | | |
|---|---|---|
| CN | 102347603 A | 2/2012 |
| CN | 202564928 U | 11/2012 |
| CN | 202737730 U | 2/2013 |
| CN | 202906778 U | 4/2013 |
| CN | 103326547 A | 9/2013 |
| CN | 103336235 A | 10/2013 |
| CN | 104702253 A | 6/2015 |
| CN | 104935315 A | 9/2015 |

OTHER PUBLICATIONS

First Office Action regarding Chinese Application No. 201510415519.0, dated May 31, 2017. Translation provided by Dragon Intellectual Property Law Firm.
Written Opinion of the International Searching Authority and International Search Report regarding International Application No. PCT/CN2015/098214, dated Apr. 19, 2016. Translation provided by Dragon Intellectual Property Law Firm.

* cited by examiner

INSULATED GATE BIPOLAR TRANSISTOR DRIVING CIRCUIT

CROSS-REFERENCE TO RELATED APPLICATIONS

This application is the U.S. national phase of PCT Application No. PCT/CN2015/098214 filed on Dec. 22, 2015, which claims a priority of the Chinese Patent Application No. 201510415519.0 filed before the SIPO on Jul. 15, 2015, the disclosures of which are incorporated in their entirety by reference herein.

TECHNICAL FIELD

The present disclosure relates to the field of the Insulated Gate Bipolar Transistor (IGBT) driving technology, in particular to an IGBT driving circuit.

BACKGROUND

The Insulated Gate Bipolar Transistor (IGBT) is a novel composite device with a characteristic of being easily driven as well as advantages such as a low driving voltage and a large current capacity. The operating frequency of the IGBT is within a frequency range of a few tens of kilohertz (kHz), and thus, the IGBT has play an important role in the application of high and medium power electronic devices with relatively high frequencies.

The IGBT driving circuit is an interface circuit between an IGBT and a digital signal processing (DSP) chip, and configured to convert control signals from a DSP into a driving signal having enough power so as to realize safe turning-on and turning-off of the IGBT and provide electrical isolation between the DSP and the IGBT. For correctly and effectively protecting the IGBT when faults occur in a system, the IGBT driving circuit also needs to provide the fault protection functions, such as over-current, over-voltage and short-circuit protection functions.

SUMMARY

An object of the present disclosure is to provide an IGBT driving circuit, so as to ensure the safe turning-on and turning-off of the IGBT, provide electrical isolation between the DSP and the IGBT, and provide the fault protection functions, such as over-current, over-voltage and short-circuit protection functions.

For achieving the above object, the present disclosure provides an IGBT driving circuit, which includes an optocoupler chip and a power amplification circuit, wherein the optocoupler chip includes an isolation amplification unit and a fault protection unit, and the fault protection unit includes a desaturation module and a fault feedback module. The isolation amplification unit is configured to carry out an optoelectronic isolation on an external driving signal input by an external controller and amplify the isolated external driving signal so as to obtain an IGBT driving signal. The power amplification circuit is configured to carry out power amplification of the IGBT driving signal and output the amplified IGBT driving signal to a gate electrode of an IGBT. The desaturation module is configured to transmit a warning signal to the fault feedback module when detecting that a potential of a collector of the IGBT is overhigh or the potential of the collector of the IGBT changes overfast. The fault feedback module is configured to transmit a fault control signal to the external controller after receiving the warning signal so as to control the external driving signal outputted by the external controller and enable the isolation amplification unit to output the IGBT driving signal for controlling the IGBT to be turned off.

Alternatively, the fault protection unit further includes a voltage clamp module, which is configured to transmit the warning signal to the fault feedback module or clamp the potential of the collector of the IGBT when detecting that the potential of the collector of the IGBT is overhigh or the potential of the collector of the IGBT changes overfast.

Alternatively, the power amplification circuit includes a push-pull power amplification unit.

Alternatively, the push-pull power amplification unit includes a first transistor, a gate electrode of which is connected to the IGBT driving signal, a first electrode of which is connected to a first voltage, and a second electrode of which is connected to the gate electrode of the IGBT, and a second transistor, a gate electrode of which is connected to the IGBT driving signal, a first electrode of which is connected to a second voltage, and a second electrode of which is connected to the gate electrode of the IGBT.

Alternatively, the push-pull power amplification unit further includes a first resistor, which is connected to the gate electrode of the first transistor and the second electrode of the first transistor, and a first capacitor, which is connected to the gate electrode of the second transistor and the first electrode of the second transistor.

Alternatively, the power amplification circuit further includes a second resistor, which is connected between an IGBT driving signal output end of the optocoupler chip and the gate electrode of the first transistor, a third resistor, which is connected between the second electrode of the first transistor and the gate electrode of the IGBT, a fourth resistor, which is connected between the first electrode of the second transistor and the second electrode of the second transistor, a voltage regulator, which is connected between the gate electrode of the IGBT and the ground, and is configured to stabilize the amplified IGBT driving signal, and a first filter, which is connected between the gate electrode of the IGBT and the ground, and is configured to filter the amplified IGBT driving signal.

Alternatively, the voltage regulator includes a first Zener diode, a cathode of which is connected to the gate electrode of the IGBT, and a second Zener diode, an anode of which is connected to an anode of the first Zener diode, and a cathode of which is connected to the ground.

Alternatively, the first filter includes a fifth resistor and a second capacitor connected in parallel, a first end of the fifth resistor is connected to the gate electrode of the IGBT, and the second end of the fifth resistor is connected to the ground, and an emitter of the IGBT is connected to the ground.

Alternatively, a model number of the optocoupler chip is FOD8332.

Alternatively, the IGBT driving circuit of the present disclosure further includes a collector potential detection unit, which is connected to the collector of the IGBT, and is connected to the desaturation module through a DESAT pin of the optocoupler chip, the desaturation module is configured to detect whether the potential of the collector of the IGBT is overhigh and whether the potential of the collector of the IGBT changes overfast through the collector potential detection unit, when the desaturation module in the optocoupler chip detects that the potential of the collector of the IGBT is overhigh or the potential of the collector of the IGBT changes overfast, the fault feedback module in the optocoupler chip transmits the fault control signal to the external controller through a FAULT pin.

Alternatively, the collector potential detection unit includes a third capacitor, a first end of which is connected to a VE pin of the optocoupler chip, and a second end of which is connected to the DESAT pin, a sixth resistor, a first end of which is connected to the first end of the third capacitor, a first diode, an anode of which is connected to a second end of the sixth resistor, and a cathode of which is connected to the collector of the IGBT, and a third Zener diode, a cathode of which is connected to the VE pin of the optocoupler chip through the third capacitor, and an anode of which is connected to the ground.

Alternatively, when a voltage applied to a VDD pin of the optocoupler chip is smaller than a predetermined voltage, the optocoupler chip stops working.

Alternatively, the IGBT driving circuit of the present disclosure further includes a fourth capacitor, a first end of which is connected to a VCLAMP pin of the optocoupler chip, and a second end of which is connected to the VDD pin of the optocoupler chip, and a second filter, which is connected between the VDD pin of the optocoupler chip and the VE pin of the optocoupler chip.

Alternatively, the second filter includes a fifth capacitor and a seventh resistor connected in parallel.

Alternatively, the optocoupler chip is connected to the external driving signal input by the external controller through a VLED-pin, and outputs the IGBT driving signal through a VO pin.

Compared with the related arts, the IGBT driving circuit of the present disclosure uses the optocoupler chip to drive the IGBT, so it is able to carry out an optoelectronic isolation on the external driving signal inputted by the external controller and amplify the isolated external driving signal to obtain the IGBT driving signal. After the power of the IGBT driving signal is amplified, the signal is outputted to the gate electrode of the IGBT to drive the IGBT, and has the fault protection functions such as over-voltage, over-current, and short-circuit protection functions.

DETAILED DESCRIPTION

The present disclosure will be described hereinafter in a clear and complete manner in conjunction with the drawings and embodiments. Obviously, the following embodiments merely relate to parts of, rather than all of, the embodiment of the present invention, and a person skilled in the art, without any creative effort, may obtain the other embodiments based thereon, which also falls within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Figure 1:
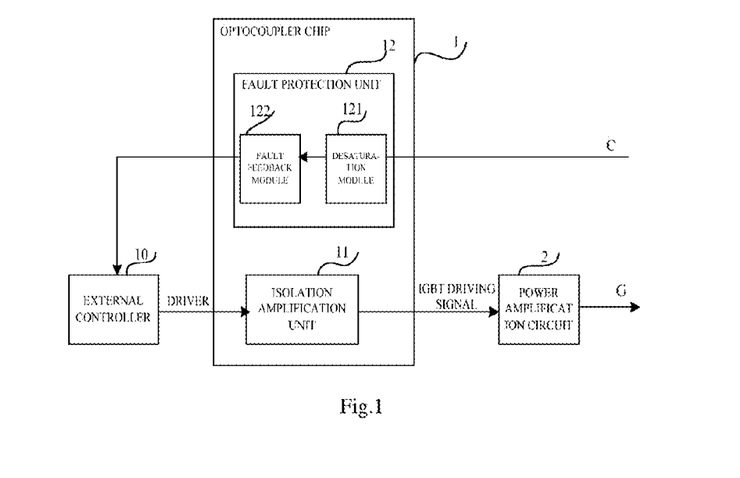
FIG. 1 is a block diagram showing a structure of an IGBT driving circuit according to one embodiment of the present disclosure.

As shown in FIG. 1, the present disclosure provides in an embodiment an IGBT driving circuit, which includes an optocoupler chip 1 and a power amplification circuit 2. The optocoupler chip 1 includes an isolation amplification unit 11 and a fault protection unit 12, and the fault protection unit 12 includes a desaturation module 121 and a fault feedback module 122. The isolation amplification unit 11 is configured to carry out optoelectric isolation on an external driving signal inputted by an external controller 10 and amplify the isolated external driving signal so as to obtain an IGBT driving signal. The power amplification circuit 2 is configured to carry out power amplification on the IGBT driving signal and output the amplified IGBT driving signal to a gate electrode G of an IGBT. The desaturation module 121 is configured to transmit a warning signal to the fault feedback module 122 when detecting that a potential of a collector C of the IGBT is overhigh or the potential of the collector C of the IGBT changes overfast. The fault feedback module 122 is configured to transmit a fault control signal FAULT to the external controller 10 after receiving the warning signal so as to control the external driving signal DRIVER outputted by the external controller 10 and enable the isolation amplification unit 11 to output an IGBT driving signal for controlling the IGBT to be turned off.

The IGBT driving circuit in the embodiment of the present disclosure uses the optocoupler chip to drive the IGBT, so it is able to carry out the optoelectronic isolation on the external driving signal inputted by the external controller and amplify the isolated driving signal so as to obtain the IGBT driving signal. After the power of the IGBT driving signal is amplified, it is outputted to the gate electrode of the IGBT to drive the IGBT, and has the fault protection functions such as over-voltage, over-current, and short-circuit protection functions.

Alternatively, the fault protection unit further includes a voltage clamp module, which is configured to transmit the warning signal to the fault feedback module or clamp the potential of the collector electrode of the IGBT when detecting that the potential of the collector of the IGBT is overhigh or the potential of the collector of the IGBT changes overfast.

Alternatively, the power amplification circuit includes a push-pull power amplification unit. The push-pull power amplification unit uses two power bipolar junction transistors (BJTs) or metallic oxide semiconductor field effect transistors (MOSFETs), which are of the same parameter, presented in the circuit in a push-pull manner, and in charge of amplifying the waveforms of positive and negative semi-circumferences, respectively. Only one of the two symmetrical power switch transistors is turned on every time the circuit is under operation, and thus, the turning-on loss is small but the efficiency is high.

The transistors in all the embodiments of the present disclosure can be a thin film transistor or field-effect transistors or other devices having the same characteristic. In the embodiments of the present disclosure, in order to differentiate two electrodes of a transistor other than the gate electrode, a first electrode of the transistor can be a source electrode or a drain electrode while a second electrode of the transistor can be a drain electrode or a source electrode. In addition, the transistor can be divided into an N-type transistor or a P-type transistor according to the characteristics of the transistor. In the driving circuit provided in embodiments of the present disclosure, all the transistors are explained by taking the N-type or P-type transistors as an example. A person skilled in the art can easily conceive of using the P-type or N-type for realization without paying off any creative work, which also falls within the scopes of the embodiments of the present disclosure.

Figure 2A:
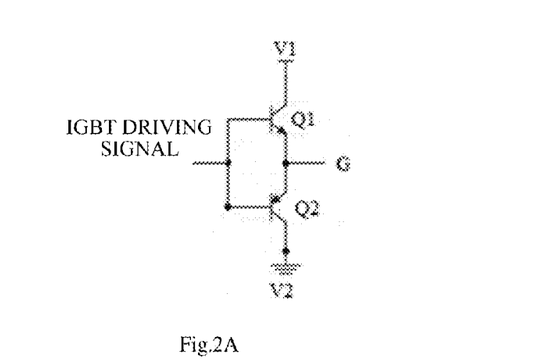
FIG. 2A is a circuit diagram of a push-pull power amplification unit included in a power amplification circuit of the IGBT driving circuit according to one embodiment of the present disclosure.

Alternatively, as shown in FIG. 2A, the push-pull power amplification unit may include a first transistor Q1, a gate electrode of which is connected to the IGBT driving signal, a first electrode of which is connected to a first voltage V1, and a second electrode of which is connected to the gate electrode G of the IGBT, and a second transistor Q2, a gate electrode of which is connected to the IGBT driving signal, a first electrode of which is connected to a second voltage V2, and a second electrode of which is connected to the gate electrode G of the IGBT.

In the push-pull power amplification unit shown in FIG. 2A, the first transistor Q1 is an N-type transistor, the second transistor Q2 is a P-type transistor, the first voltage V1 can be a high voltage VCC, and the second voltage V2 can be a low voltage VEE.

Figure 2B:
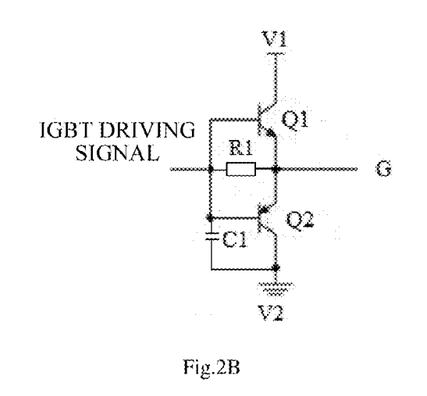
FIG. 2B is another circuit diagram of the push-pull power amplification unit included in the power amplification circuit of the IGBT driving circuit according to one embodiment of the present disclosure.

Alternatively, as shown in FIG. 2B, the push-pull power amplification unit further includes a first resistor R1, which is connected to the gate electrode of the first transistor Q1 and the second electrode of the first transistor Q1, and a first capacitor C1, which is connected to the gate electrode of the second transistor Q2 and the first electrode of the second transistor Q2.

Figure 2C:
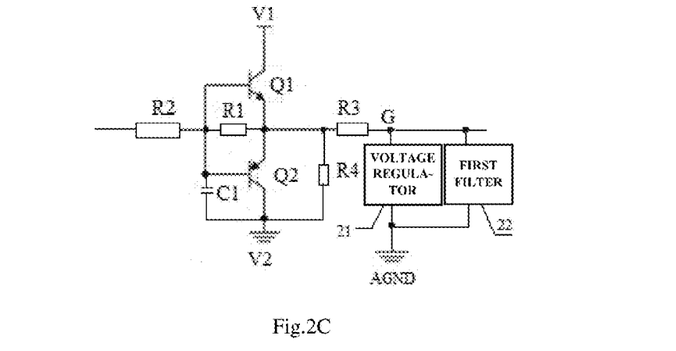
FIG. 2C is a circuit diagram of the power amplification circuit included in the IGBT driving circuit according to one embodiment of the present disclosure.

Alternatively, as shown in FIG. 2C, the power amplification circuit further includes a second resistor R2, which is connected between an IGBT driving signal output end of the optocoupler chip and the gate electrode of the first transistor Q1, a third resistor R3, which is connected between the second electrode of the first transistor Q1 and the gate electrode G of the IGBT, a fourth resistor R4, which is connected between the first electrode of the second transistor Q2 and the second electrode of the second transistor Q2, a voltage regulator 21, which is connected between the gate electrode G of the IGBT and the ground AGND, and is configured to stabilize the amplified IGBT driving signal, and a first filter 22, which is connected between the gate electrode G of the IGBT and the ground AGND, and is configured to filter the amplified IGBT driving signal.

Figure 2D:
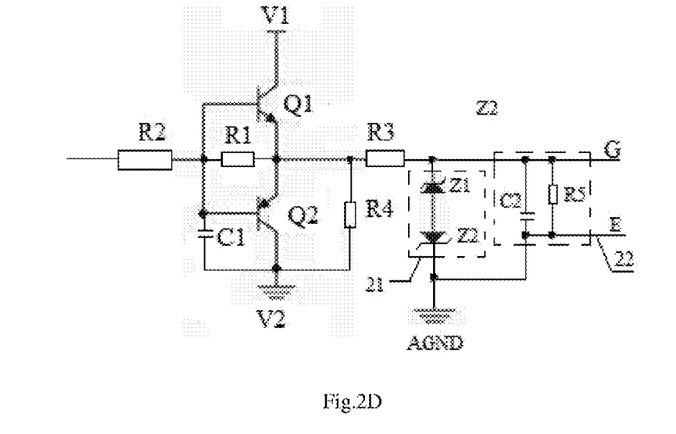
FIG. 2D is another circuit diagram of the power amplification circuit included in the IGBT driving circuit according to one embodiment of the present disclosure.

Alternatively, as shown in FIG. 2D, the voltage regulator 21 includes a first Zener diode Z1, a cathode of which is connected to the gate electrode G of the IGBT, and a second Zener diode Z2, an anode of which is connected to the anode of the first Zener diode Z1, and a cathode of which is connected to the ground.

Alternatively, as shown in FIG. 2D, the first filter 22 includes a fifth resistor R5 and a second capacitor C2 connected in parallel. A first end of the fifth resistor R5 is connected to the gate electrode G of the IGBT, and the second end of the fifth resistor R5 is connected to the ground AGND. An emitter E of the IGBT is connected to the ground AGND.

Alternatively, a model number of the optocoupler chip can be FOD8332. Alternatively, the optocoupler chip can be any optocoupler chip having the fault protection functions such as over-voltage, over-current, and short-circuit protection functions, for the IGBT.

Alternatively, the IGBT driving circuit of the present disclosure further includes a collector potential detection unit, which is connected to the collector of the IGBT, and is connected to the desaturation module through a DESAT pin of the optocoupler chip. The desaturation module detects whether the potential of the collector of the IGBT is overhigh and whether the potential of the collector of the IGBT changes overfast through the collector potential detection unit. When the desaturation module in the optocoupler chip detects that the potential of the collector of the IGBT is overhigh or the potential of the collector of the IGBT changes overfast, the fault feedback module in the optocoupler chip transmits the fault control signal to the external controller through a $\overline{\text{FAULT}}$ pin of the optocoupler chip.

Due to the addition of the collector potential detection unit to the IGBT driving circuit, in the embodiments of the present disclosure, the IGBT driving circuit can conveniently detect whether the potential of the collector of the IGBT is overhigh or the potential of the collector C of the IGBT changes overfast so as to conveniently detect occurrences of over-current, over-voltage and short-circuit of the IGBT.

Alternatively, the collector potential detection unit includes a third capacitor, a first end of which is connected to a VE pin of the optocoupler chip, and a second end of which is connected to the DESAT pin, a sixth resistor, a first end of which is connected to the first end of the third capacitor, a first diode, an anode of which is connected to a second end of the sixth resistor, and a cathode of which is connected to the collector of the IGBT, and a third Zener diode, a cathode of which is connected to the VE pin of the optocoupler chip through the third capacitor C3, and an anode of which is connected to the ground.

Alternatively, when a voltage applied to a VDD pin of the optocoupler chip is smaller than a predetermined voltage, the optocoupler chip stops working, thereby having a under-voltage protection function.

Alternatively, the IGBT driving circuit of the present disclosure further includes a fourth capacitor, a first end of which is connected to a VCLAMP pin of the optocoupler chip, and a second end of which is connected to a VDD pin of the optocoupler chip, and a second filter, which is connected between the VDD pin of the optocoupler chip and the VE pin of the optocoupler chip.

Alternatively, the second filter includes a fifth capacitor and a seventh resistor connected in parallel.

Alternatively, the optocoupler chip is connected to the external driving signal input by the external controller through a VLED− pin, and outputs the IGBT driving signal through a VO pin.

The IGBT driving circuit of the present disclosure will be described in detail with a specific embodiment as follows.

Figure 3A:
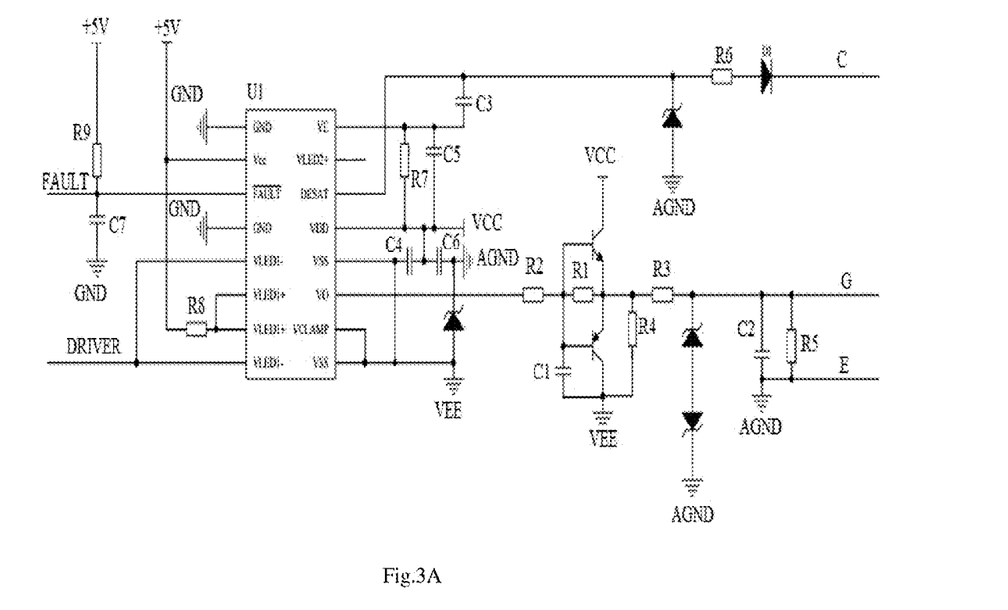
FIG. 3A is a circuit diagram of the IGBT driving circuit according to one embodiment of the present disclosure.

In the IGBT driving circuit of an embodiment of the present disclosure as shown in FIG. 3A, the model number of the optocoupler chip is FOD8332.

As shown in FIG. 3A, the desaturation module (not shown in FIG. 3A) in the optocoupler chip U1 is connected to the collector C of the IGBT through the DESAT pin and the collector potential detection unit, the desaturation module detects whether the potential of the collector C of the IGBT is overhigh or the potential of the collector C of the IGBT changes overfast through the collector potential detection unit. When the desaturation module in the optocoupler chip U1 detects that the potential of the collector C of the IGBT is overhigh or the potential of the collector C of the IGBT changes overfast, the fault feedback module (not shown in FIG. 3A) in the optocoupler chip U1 transmits the fault control signals FAULT with a low level to the external DSP chip (not shown in FIG. 3A) through the $\overline{\text{FAULT}}$ pin of the optocoupler chip U1.

In the embodiment as shown in FIG. 3A of the present disclosure, the power amplification unit includes the push-pull power amplification unit. The push-pull power amplification unit includes a first transistor Q1, a gate electrode of which is connected to the IGBT driving signal, a first electrode of which is connected to a high voltage VCC, and a second electrode of which is connected to the gate electrode of the IGBT, and a second transistor Q2, a gate electrode of which is connected to the IGBT driving signal, a first electrode of which is connected to a low voltage VEE, and a second electrode of which is connected to the gate electrode of the IGBT. Q1 is an n type transistor, and Q2 is a p type transistor.

The push-pull power amplification unit further includes a first resistor R1, which is connected between the gate electrode of the first transistor Q1 and the second electrode of the first transistor Q2, and a first capacitor C1, which is connected between the gate electrode of the second transistor Q2 and the first electrode of the second transistor Q2.

The power amplification circuit further includes a second resistor R2, which is connected between an IGBT driving signal output end of the optocoupler chip and the gate electrode of the first transistor Q1, a third resistor R3, which is connected between the second electrode of the first transistor Q1 and the gate electrode G of the IGBT, a fourth resistor R4, which is connected between the first electrode of the second transistor Q2 and the second electrode of the second transistor Q2, a voltage regulator, which is connected between the gate electrode G of the IGBT and the ground AGND, and is configured to stabilize the amplified IGBT driving signal, and a first filter, which is connected between the gate electrode G of the IGBT and the ground AGND, and is configured to filter the amplified IGBT driving signal.

The regulator includes a first Zener diode Z1, a cathode of which is connected to the gate electrode G of the IGBT, and a second Zener diode Z3, an anode of which is connected to the anode of the first Zener diode Z1, and a cathode of which is connected to the ground.

The first filter includes a fifth resistor R5 and a second capacitor C2 connected in parallel. A first end of the fifth resistor R5 is connected to the gate electrode G of the IGBT, and the second end of the fifth resistor R5 is connected to the ground AGND, and an emitter E of the IGBT is connected to the ground AGND.

The collector potential detection unit includes a third capacitor C3, a first end of which is connected to a VE pin of the optocoupler chip U1, and a second end of which is connected to the DESAT pin, a sixth resistor R6, a first end of which is connected to the first end of the third capacitor C3, a first diode D1, an anode of which is connected to a second end of the sixth resistor R6, and a cathode of which is connected to the collector C of the IGBT, and a third Zener diode Z3, a cathode of which is connected to the VE pin of the optocoupler chip, and an anode of which is connected to the ground AGND.

The IGBT driving circuit shown in FIG. 3A of the present disclosure further includes a fourth capacitor C4, a first end of which is connected to a VCLAMP pin of the optocoupler chip U1, and a second end of which is connected to a VDD pin of the optocoupler chip U1, and a second filter, which is connected between the VDD pin of the optocoupler chip U1 and the VE pin of the optocoupler chip U1. The VSS pin of the optocoupler chip U1 is connected to the VCLAMP pin of the optocoupler chip U1. The second filter includes a fifth capacitor C5 and a seventh resistor R7 connected in parallel. The optocoupler chip U1 is connected to the external driving signal DRIVER inputted by the external DSP chip through a VLED− pin, and outputs the IGBT driving signal through a VO pin.

The IGBT driving circuit shown in FIG. 3A of the present disclosure further includes a sixth capacitor, which is connected between the VDD pin of the optocoupler chip U1 and the ground AGND, a fourth Zener diode Z4, the anode of which is connected to the VSS pin of the optocoupler chip U1, and a cathode of which is connected to the ground AGND, an eighth resistor, which is connected between the VLED+ pin of the optocoupler chip and a +5V power supply, a ninth resistor, which is connected between the $\overline{\text{FAULT}}$ pin of the optocoupler chip U1 and the +5V power supply, and a seventh capacitor, which is connected between the $\overline{\text{FAULT}}$ pin of the optocoupler chip U1 and the ground GND at a front end of the optocoupler chip U1. The VCLAMP pin of the optocoupler chip U1 and the VSS pin of the optocoupler chip U1 are both connected to the low level VEE. The GND pin of the optocoupler chip U1 is connected to the ground GND at the front end of the optocoupler chip U1.

Figure 3B:
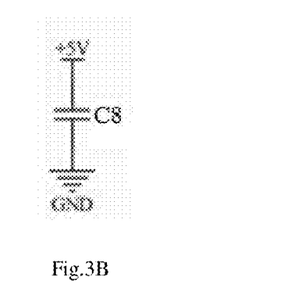
FIG. 3B is a circuit diagram showing a connection between a +5V power supply and a ground GND.

In addition, as shown in FIG. 3B, an eighth capacitor C8 is connected between the +5V power supply and the ground GND.

Figure 3C:
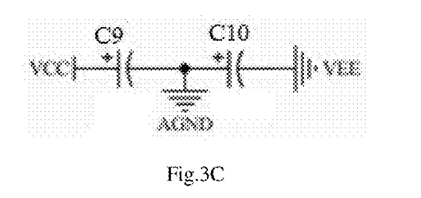
FIG. 3C is a circuit diagram showing a connection between a high voltage output end that outputs a high voltage VCC and a low voltage output end that outputs a low voltage VEE.

As shown in FIG. 3C, a ninth capacitor C9 and a tenth capacitor C10 are connected in series between the high voltage output end that outputs the high voltage VCC and the low voltage output end that outputs the low voltage VEE. One end of the ninth capacitor C9 that is connected to the tenth capacitor C10 is connected to the ground AGND.

Alternatively, in FIGS. 3A, 3B and 3C, the capacitance values of C1 and C2 can be 10 Nf, the capacitance value of C3 can be 100 pF, the capacitance values of C4, C5, C6, C7 and C8 can be 0.1 uF, and the capacitance values of C9 and C10 can be 47 uF.

In the IGBT driving circuit of the embodiment of the present disclosure as shown in FIG. 3A, the model number of the optocoupler chip U1 is FOD8332, which has the isolation fault detection feedback function, the under-voltage protection function and the active miller clamp function. During actual operations, the optocoupler chip U1 can use other chips which may be of different types but have the same functions. For example, the model number of the optocoupler chip U1 can be ACPL332J.

Alternatively, when the IGBT driving circuit shown in FIG. 3A is working, the input end and the output end of the optocoupler chip U1 are provided with isolated power sources. The input end may be powered with a single source, and the output end may be powered with a dual power source, The external driving signal DRIVER provided by the external DSP chip is connected to the VLED1− pin of the optocoupler chip U1, and the VLED+ pin of the optocoupler chip U1 is connected to the +5V power supply, The external driving signal may be a direct current square-wave signal, and of a high level or a low level. According to an embodiment, the potential of the external driving signal can be +15 or −5V. When the potential of the external driving signal is −5V, the optocoupler chip U1 outputs, through its VO pin, the IGBT driving signal that controls the IGBT to be turned on. When the potential of the external driving signal is +15V, the optocoupler chip U1 outputs, through the VO pin, the IGBT driving signal that controls the IGBT to be turned off, so as to ensure the reliability of turning-on and turning-off of the IGBT and prevent the false triggering.

In addition, the optocoupler chip U1 has the under-voltage protection function. When the potential of the voltage applied to the VDD pin of the optocoupler chip U1 is less than 13V, the output pulse of the optocoupler chip U1 will be blocked.

The DESAT pin, the $\overline{\text{FAULT}}$ pin of the optocoupler chip U1, and the desaturation module and the fault feedback module in the U1 are used for the faults protection, such as over-voltage, over-current, and short-circuit protection, for the IGBT. Alternatively, when IGBT is normally operating, the potential of the third capacitor C3 that is connected to the VE pin of the optocoupler chip U1 is relatively low. However, when faults, such as the over-current, the short-circuit, the over-voltage and the like, occur in the IGBT (i.e. the potential of the collector C of the IGBT changes overfast, or the potential of the collector C of the IGBT is overhigh), the potential of the end of the third capacitor C3 that is connected to the VE pin of the optocoupler chip U1 will be overhigh. Therefore, the desaturation module in the optocoupler chip U1 can detect, through the DESAT pin of the U1, that the potential of the collector C of the IGBT is overhigh or the potential of the collector C of the IGBT changes overfast, so that the fault feedback module (not shown in FIG. 3A) in the optocoupler chip U1 transmits the fault control signal $\overline{\text{FAULT}}$ having a low level to the external DSP chip (not shown in FIG. 3A) through the FAULT pin of the optocoupler chip U1. After receiving the fault control signal FAULT, the external DSP chip transmits the external driving signal DRIVER having a potential of +15V to the optocoupler chip U1 so as to control the optocoupler chip U1 to output the IGBT driving signal that controls the IGBT to be turned off by means of its VO pin, thereby finally completing the protection function.

In addition, the optocoupler chip U1 with the module number of FOD8332 is provided internally with the active miller clamp function. When detecting the potential of the collector C of the IGBT is overhigh or the potential of the collector C of the IGBT changes overfast via the VCLAMP pin, the optocoupler chip U1 transmits the warning signal to the fault feedback module or clamps the potential of the collector of the IGBT.

The above embodiments are merely the embodiments of the present disclosure. It should be pointed out that a person skilled in the art may make further variations and substitutions without departing from the principle of the present disclosure, and these variations and substitutions shall also be included in the scope of the present disclosure.

What is claimed is:
1. An insulated gate bipolar transistor (IGBT) driving circuit, comprising:
an optocoupler chip; and
a power amplification circuit,
wherein:
the optocoupler chip comprises an isolation amplification unit and a fault protection unit, and the fault protection unit comprises a desaturation module and a fault feedback module,
the isolation amplification unit is configured to carry out optoelectric isolation on an external driving signal inputted by an external controller and amplify the isolated external driving signal so as to obtain an IGBT driving signal,
the power amplification circuit is configured to carry out power amplification on the IGBT driving signal and output the amplified IGBT driving signal to a gate electrode of an IGBT,
the desaturation module is configured to transmit a warning signal to the fault feedback module when detecting that a potential of a collector of the IGBT is overhigh or the potential of the collector of the IGBT changes overfast,
the fault feedback module is configured to transmit a fault control signal to the external controller after receiving the warning signal so as to control the external driving signal outputted by the external controller and enable the isolation amplification unit to output an IGBT driving signal for controlling the IGBT to be turned off,
the power amplification circuit comprises a push-pull power amplification unit,
the push-pull power amplification unit comprises:
a first transistor, a gate electrode of which is connected to the IGBT driving signal, a first electrode of which is connected to a first voltage, and a second electrode of which is connected to the gate electrode of the IGBT,
a second transistor, a gate electrode of which is connected to the IGBT driving signal, a first electrode of which is connected to a second voltage, and a second electrode of which is connected to the gate electrode of the IGBT,
a first resistor, which is connected between the gate electrode of the first transistor and the second electrode of the first transistor, and
a first capacitor, which is connected between the gate electrode of the second transistor and the first electrode of the second transistor, and
the power amplification circuit further comprises:
a second resistor, which is connected between an IGBT driving signal output end of the optocoupler chip and the gate electrode of the first transistor,
a third resistor, which is connected between the second electrode of the first transistor and the gate electrode of the IGBT,
a fourth resistor, which is connected between the first electrode of the second transistor and the second electrode of the second transistor,
a voltage regulator, which is connected between the gate electrode of the IGBT and the ground, and configured to stabilize the amplified IGBT driving signal, and
a first filter which is connected between the gate electrode of the IGBT and the ground, and configured to filter the amplified IGBT driving signal.

2. The IGBT driving circuit according to claim 1, wherein the fault protection unit further comprises a voltage clamping module, which is configured to transmit the warning signal to the fault feedback module or clamp the potential of the collector of the IGBT when detecting that the potential of the collector of the IGBT is overhigh or the potential of the collector of the IGBT changes overfast.

3. The IGBT driving circuit according to claim 1, wherein the voltage regulator comprises:
   a first Zener diode, a cathode of which is connected to the gate electrode of the IGBT, and
   a second Zener diode, an anode of which is connected to an anode of the first Zener diode, and a cathode of which is connected to the ground.

4. The IGBT driving circuit according to claim 1, wherein:
   the first filter comprises a fifth resistor and a second capacitor connected in parallel,
   a first end of the fifth resistor is connected to the gate electrode of the IGBT, and a second end of the fifth resistor is connected to the ground, and
   an emitter of the IGBT is connected to the ground.

5. An insulated gate bipolar transistor (IGBT) driving circuit, comprising:
   an optocoupler chip; and
   a power amplification circuit,
   wherein:
      the optocoupler chip comprises an isolation amplification unit and a fault protection unit, and the fault protection unit comprises a desaturation module and a fault feedback module,
      the isolation amplification unit is configured to carry out optoelectric isolation on an external driving signal inputted by an external controller and amplify the isolated external driving signal so as to obtain an IGBT driving signal,
      the power amplification circuit is configured to carry out power amplification on the IGBT driving signal and output the amplified IGBT driving signal to a gate electrode of an IGBT,
      the desaturation module is configured to transmit a warning signal to the fault feedback module when detecting that a potential of a collector of the IGBT is overhigh or the potential of the collector of the IGBT changes overfast,
      the fault feedback module is configured to transmit a fault control signal to the external controller after receiving the warning signal so as to control the external driving signal outputted by the external controller and enable the isolation amplification unit to output an IGBT driving signal for controlling the IGBT to be turned off,
      the IGBT driving circuit further comprises a collector potential detection unit, which is connected to the collector of the IGBT, and is connected to the desaturation module through a DESAT pin of the optocoupler chip,
      the desaturation module is configured to detect whether the potential of the collector of the IGBT is overhigh and whether the potential of the collector of the IGBT changes overfast through the collector potential detection unit,
      when the desaturation module in the optocoupler chip detects that the potential of the collector of the IGBT is overhigh or the potential of the collector of the IGBT changes overfast, the fault feedback module in the optocoupler chip transmits the fault control signal to the external controller through a $\overline{\text{FAULT}}$ pin, and
      the collector potential detection unit comprises,
         a third capacitor, a first end of which is connected to a VE pin of the optocoupler chip, and a second end of which is connected to the DESAT pin,
         a sixth resistor, a first end of which is connected to the first end of the third capacitor,
         a first diode, an anode of which is connected to a second end of the sixth resistor, and a cathode of which is connected to the collector of the IGBT, and
         a third Zener diode, a cathode of which is connected to the VE pin of the optocoupler chip through the third capacitor, and an anode of which is connected to the ground.

6. The IGBT driving circuit according to claim 5, wherein when a voltage applied to a VDD pin of the optocoupler chip is smaller than a predetermined voltage, the optocoupler chip stops working.

7. The IGBT driving circuit according to claim 5, further comprising:
   a fourth capacitor, a first end of which is connected to a VCLAMP pin of the optocoupler chip, and a second end of which is connected to a VDD pin of the optocoupler chip, and
   a second filter, which is connected between the VDD pin of the optocoupler chip and the VE pin of the optocoupler chip.

8. The IGBT driving circuit according to claim 7, wherein the second filter comprises a fifth capacitor and a seventh resistor connected in parallel.

9. The IGBT driving circuit according to claim 5, wherein the optocoupler chip is connected to the external driving signal inputted by the external controller through a VLED- pin, and outputs the IGBT driving signal through a VO pin.

* * * * *

UNITED STATES PATENT AND TRADEMARK OFFICE
CERTIFICATE OF CORRECTION

PATENT NO. : 9,960,766 B2
APPLICATION NO. : 15/108593
DATED : May 1, 2018
INVENTOR(S) : Qingmeng Wang et al.

It is certified that error appears in the above-identified patent and that said Letters Patent is hereby corrected as shown below:

On the Title Page

The second Assignee is listed as:
BEIJING BOE TECHNOLOGY CO., LTD.

Should be listed as:
BEIJING BOE ENERGY TECHNOLOGY CO., LTD.

Signed and Sealed this
Seventeenth Day of July, 2018

Andrei Iancu
*Director of the United States Patent and Trademark Office*